US012612181B2

(12) United States Patent　　(10) Patent No.:　US 12,612,181 B2

Kunnumpurath　　(45) Date of Patent:　　Apr. 28, 2026

(54) SKY VOICE ALERT LHA 500 FOR GENERAL AVIATION AIRCRAFT

(71) Applicant: Francis J Kunnumpurath, Lafayette, NY (US)

(72) Inventor: Francis J Kunnumpurath, Lafayette, NY (US)

( * ) Notice: Subject to any disclaimer, the term of this patent is extended or adjusted under 35 U.S.C. 154(b) by 252 days.

(21) Appl. No.: 18/624,797

(22) Filed: Apr. 2, 2024

(65) Prior Publication Data

US 2025/0162726 A1　　May 22, 2025

Related U.S. Application Data

(60) Provisional application No. 63/526,510, filed on Jul. 13, 2023.

(51) Int. Cl.
| | |
|---|---|
| *B64D 45/04* | (2006.01) |
| *G01S 17/933* | (2020.01) |
| *G08G 5/21* | (2025.01) |
| *G08G 5/23* | (2025.01) |
| *H05K 5/00* | (2025.01) |

(52) U.S. Cl.
CPC .............. *B64D 45/04* (2013.01); *G08G 5/21* (2025.01); *G08G 5/23* (2025.01); *G01S 17/933* (2013.01); *H05K 5/0026* (2013.01)

(58) Field of Classification Search
CPC . B64D 45/04; G08G 5/21; G08G 5/23; G01S 17/933; G08B 3/00; H05K 5/0026
See application file for complete search history.

(56) References Cited

U.S. PATENT DOCUMENTS

| | | | | |
|---|---|---|---|---|
| 7,557,734 | B2 * | 7/2009 | Estrada, III | ............. G01S 17/95 |
| | | | | 340/963 |
| 2016/0274437 | A1 * | 9/2016 | Russo | .................... G02B 27/10 |
| 2020/0191821 | A1 * | 6/2020 | Rondeau | .............. G01S 7/4812 |
| 2021/0055418 | A1 * | 2/2021 | Hopper | .................. B64U 20/87 |
| 2021/0354806 | A1 * | 11/2021 | Kim | .......................... G08G 5/21 |
| 2023/0027776 | A1 * | 1/2023 | Sherman | .................. G08G 5/53 |
| 2024/0348909 | A1 * | 10/2024 | Lapstun | ............. G01C 21/3852 |
| 2025/0136290 | A1 * | 5/2025 | Umezawa | .............. B64D 45/00 |

FOREIGN PATENT DOCUMENTS

| | | | | | |
|---|---|---|---|---|---|
| CA | 3010372 | A1 * | 1/2019 | .......... | G01C 23/005 |
| EP | 3671697 | A1 * | 6/2020 | .............. | G08G 5/74 |
| WO | WO-2015200086 | A1 * | 12/2015 | ............. | B64D 45/04 |
| WO | WO-2022170401 | A1 * | 8/2022 | .......... | G06F 18/251 |

* cited by examiner

*Primary Examiner* — Lewis G West

(74) *Attorney, Agent, or Firm* — Bernhard P. Molldrem, Jr.

(57) ABSTRACT

A Lidar-based SkyVoice Alert LHA 500 for a general aviation aircraft provides audible announcements of height above a landing surface (e.g., a runway) when the aircraft that is descending on approach or taking off, reaches a specific height above the ground. It gives repeated Gear warnings until the Gear is down and locked. It audibly announces preset GPS/MSL heights. It also announces various user selectable reminders like CheckList, LC GUMPS, Flaps, Check Oxygen, Check Altimeter, Check Fuel, Switch Tank, Top of Descent. The SkyVoice Alert LHA 500 is contained in a housing that mounts onto a removable access plate in a wing cavity, with the Lidar arranged to provide a vertical downward beam though a window formed in the access plate. A connector cable provides connection and disconnection between the SkyVoice Alert LHA 500 and the plane's audio panel.

7 Claims, 9 Drawing Sheets

PCB MOUNTED
SPEAKER

100

LIDAR

112

30

50

101
UPPER SIDE

SKY VOICE ALERT LHA 500 FOR GENERAL AVIATION AIRCRAFT

This application claims priority under 35 U.S.C. § 113(e) of Provisional Application Ser. No. 63/526,510, filed 13 Jul. 2023, the disclosure whereof is incorporated by reference herein.

The unit as herein disclosed is configured to start height announcements on take off or after it detects a descending flight profile. The first announcement may be e.g., at 5 feet during take off and 500 feet (or a preset height depending on the Lidar sensitivity) during landing, and then at predetermined heights. The LHA may skip the first announcement, depending on the glide path angle, takeoff/descent rate, ambient light, sun exposure, and other terrain characteristics.

The disclosed SkyVoice Alert LHA 500 announces the height audibly during the takeoff and/or landing phase. The SkyVoice Alert LHA 500 can announce the height range during a go-around maneuver if the go-around is initiated at or below a predetermined height, e.g., 100 feet.

The SkyVoice Alert LHA 500 is intended for use over a dry runway (water depth three-inches or less). SkyVoice Alert LHA 500 configuration for an amphibious or float plane is a future concern but would employ the same principles as herein disclosed.

This system accepts standard aircraft power (i.e., battery DC from a 12 volt or 24 volt system), and outputs a single-ended one-watt audio signal capable of loading a standard eight-ohm speaker or an audio input HI pin within the plane's audio panel or intercom or radio. An internal wi-fi (or blue-tooth) can provide the audio output to be received on a headset, smart-phone, tablet or similar device.

The SkyVoice Alert LHA 500 is not intended as a substitute for any certificated aircraft systems or avionics.

The preferred embodiment operates on a voltage supply from 9 V. to 28 V. (30 V. (maximum), with power consumption of 1 W (nominal), and a peak power of about 150 mA at 12 volts. The unit operates over a temperature range from −4° to +140° F. (−20° to +60° C.), and has a storage temperature range from −4° (−20° C.) to +185° F. (+60° C.). The unit itself weighs 7.58 oz (215 grams), and its dimensions are 2.95 inches (75 mm) (L) by 1.89 inches (48 mm) (W) by 2.40 inches (61 mm) (H). If the unit is to be installed on a pressurized aircraft, and if it is necessary to penetrate the pressurized compartment to allow for routing wires, that would be considered a major alteration, and may require further FAA approval, unless existing penetration wire connectors can be used.

Currently, FAA NORSEE approval of this SkyVoice Alert LHA 500 is for installation and operation on certified airplanes and limits the height announcements down to 5 feet. The appropriate selection via Wi-Fi, "Standard" mode button can be selected for operation on certified airplanes. The unit should be installed away from the engine exhaust soot stream, and the installer should verify that the installation will not interfere with any existing control rods, cables or other moving parts. Any adjacent control rods, cables or other moving parts must be checked over their full motion range. Also the unit needs an unobstructed view of the ground below.

At and near the base of the unit, the spread of the laser beam is small, about 0.5 degree, but the spread increases as distance increases. Any hard surfaces or objects, such 3as landing gear or fairings, should not be in the path of the beam. Beam diameter will not exceed more than about one inch considering the highest possible installation point.

After installation, the pilot must be able to switch off the SkyVoice Alert LHA 500, using either a dedicated audio panel "Switched" channel to disable the audio annunciation; a dedicated push-pull circuit breaker to remove power to the annunciator; or a panel-mounted toggle-switch to remove power.

During testing, range reading can be seen on a phone/tablet or PC via W-Fi to the unit and this can be set up as a Heads-Up Display.

For installation on an access panel plate, a hole or holes must be cut in the plate for the LIDAR beam. This can be a rectangular cut-out of 38 mm by 25 mm, or two 25 mm diameter holes with 14 mm between centers can also provide a clear viewing window for the Laser module of the Lidar. In addition two 0.5 mm openings, 65.70 mm apart should be cut in the access plate for screws to secure the unit to the access plate. Preferably, the unit is provided with a five-wire quick-disconnect connector cable which allows the unit to be fully removed along with the access plate for access to the wing cavity for other maintenance requirements.

The SkyVoice Alert LHA 500 unit can optionally be coupled to a GPS receiver, although that is not required for "Standard" SkyVoice Alert LHA 500 to function. This can be enabled during a Wi-Fi setup. Once connected and enabled, the unit acquires GPS signals and permits higher GPS altitude announcements, as only heights of 500 feet and below are provided from Lidar-based height measurements.

Embodiments of this invention can also detect if a voltage is present on a Gear Up or Down switch. If enabled and connected, the unit announces if it detects the Gear is still in the up position when it starts to detect the ground below (i.e., 500 feet or below).

Main Hardware Advantages of this Invention

The internal DC supply employs two electrolytic capacitors, one on the input side (12/24 volt) and the other on the output side, i.e. 3.3 volts DC. Conventional systems only use one electrolytic capacitor, that being on the 12/24 volt input side. Electrolytic capacitors provide longer life and improved performance when high frequencies are present on the input side or if a high frequency power supply is used to provide the input DC current. Conventionally a smaller-value ceramic capacitor is used at the output (3.3 v) side. The electrolytic capacitor here has a much higher capacitance, e.g. 330 µf. This helps remove HF noise from the DC output.

The microcontroller unit for the SkyVoice Alert LHA 500 has two usable UART (universal asynchronous receiver-transmitter) blocks. This means there is a hardware serial communications port for the LIDAR and another hardware serial communications port for GPS input. Hardware serial UART ports are more effective, faster and more efficient as compared with software serial communication.

The enclosure for the LIDAR and circuit boards is kept small, allowing more flexibility for installation in placing the device within the wing cavity so as not to mechanically interfere with other equipment or wiring in the wing cavity. The enclosure is dimensioned at 75 mm (length), 48 mm (width), and 61 mm (height) so that the device occupies minimal space above the inspection plate within the wing cavity of the aircraft.

The SkyVoice Alert LHA 500 has an AF mini-speaker mounted on its printed circuit board that allows the installer and the user to hear the audio announcements from the device itself (such as during installation). This can be very helpful in detecting any wiring faults while extending the wires into the aircraft's audio panel. Audio announcements can also be heard by establishing a Bluetooth connectivity from pilot's headset or audio panel to SkyVoice Alert LHA 500.

A LIDAR unit with improved measurable range is employed in a preferred embodiment, the LIDAR can be a model TF03-180-UART with a measurable range of up to 180 meters (i.e., about 590 feet) whereas prior attempts to use a LIDAR for height measurement have used units with only a measurable range of about 100 meters (less than 330 feet).

The SkyVoice Alert LHA 500 is provided with an inspection plate to match with the aircraft on which it is to be installed. The inspection plates are provided (or can be factory-ordered) e.g. to match Cessna, Piper, Bonanza planes or other airplanes, and with the apertures for the LIDAR and screw holes for mounting on the inspection opening, so the customer does not have to cut the openings for the LIDAR and the housing or for the mounting screws in the existing inspection plate(s). In most cases, the inspection plate that matches the purchaser's aircraft is included in the kit.

The SkyVoice Alert LHA 500 is designed to be powered from a DC power supply providing from 9 VDC to 28 VDC (30 volts maximum) with a nominal power consumption of 1 watt, and peak 150 milliamps at 12 volts. The operating temperature range is designed for minus 4° F. (−20° C.) to +140° F. (60° C.). Storage temperature range can be from −4° F. (−20° C.) to +185° F. (85° C.). The weight is about 215 grams (7.58 oz) and its dimensions are L=75 mm (2.95 inch) by W=48 mm (1.89 inches) by H=61 mm (2.40 inches). An optional 12-volt battery connector can be connected with the DC supply, so that a simple 12 volt battery can be used during installation where connection to the airplane power is difficult or not possible.

At the base of the unit, the spread of the laser beam is small, about 0.5 degree, but this spread increases with distance. Any aircraft surfaces, e.g. landing gear or fairings, should be avoided so as to be outside the beam, and not seen by the beam. Generally the beam does not exceed about one inch where the highest possible installation point is used.

Switching capability for the unit must be provided for the pilot, such as either a dedicated audio panel "switched" channel to disable the audio annunciator; a dedicated push-pull circuit breaker to remove the DC power, or a panel-mounted toggle switch to remove power. The switched audio input on the audio panel can also serve as a means for the pilot to disable the audio announcements.

For checking placement of the unit to see if it provides a full, unobstructed view of the ground below, an external 12 volt battery may be used as DC power supply to the unit (without having to connect the audio wires). This powers the unit and enables Wi-Fi connection to the unit to check the reported range. Wi-Fi is only available for a three-minute period if no connection is made to the Wi-Fi network.

Software in the SkyVoice Alert LHA 500 may provide an option to write and record log files, which records most actions the unit takes, and can provide them later for review. This may be helpful in troubleshooting problems in detecting and/or announcing height and other user enabled reminders.

The software has a dedicated portion to create a mirror-image of the height (in feet) that can be provided to a Heads-Up Display (HUD) that projects the height to give the pilot a visible height announcement. If the pilot wants to see, but not hear the announcements, this feature can be very helpful. An example is to provide to helicopter pilots height data when the craft is hovering over an area at some height.

The screen may show the height as a whole number of feet (or meters). The LIDAR settings in the software also allows the pilot to change Go-Around Detection Threshold, LIDAR Range Out Announcement, Take-Off/Climb-Out Duration, Touch and Go go around time, "Check Gear" Call-out Repeat Rate, and Running Average.

DETAILED DESCRIPTION OF A PREFERRED EMBODIMENT

Figure 1:
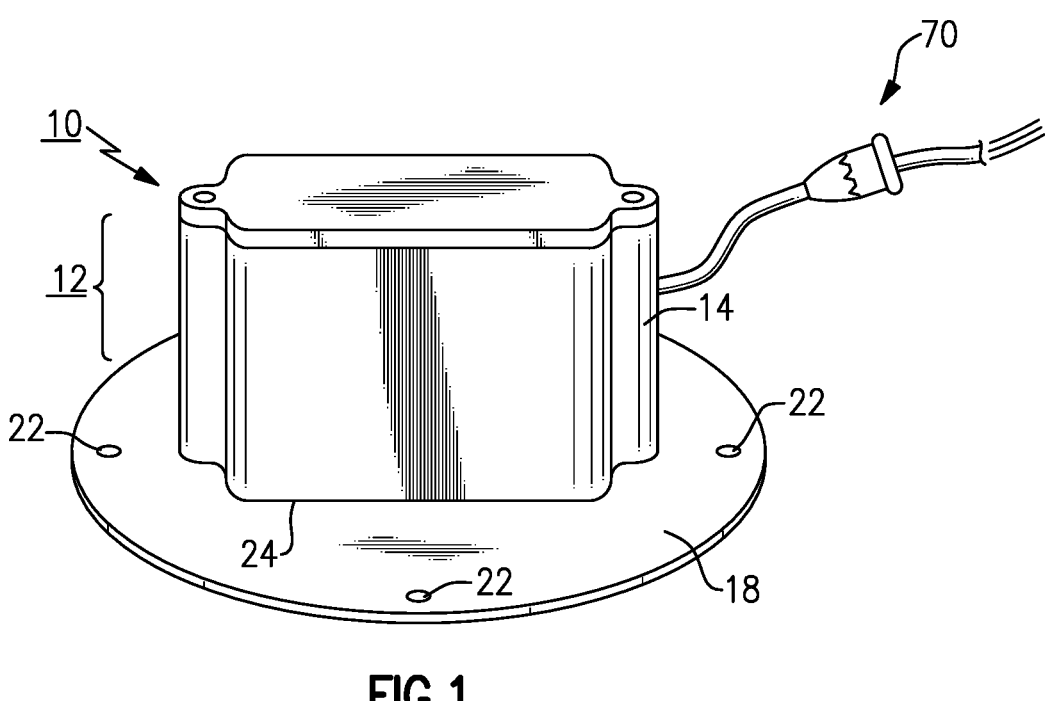
FIG. 1 is a perspective view of the SkyVoice Alert LHA 500 device according to an embodiment of the invention mounted on an access plate for a wing or empennage of an aircraft.
Figure 2:
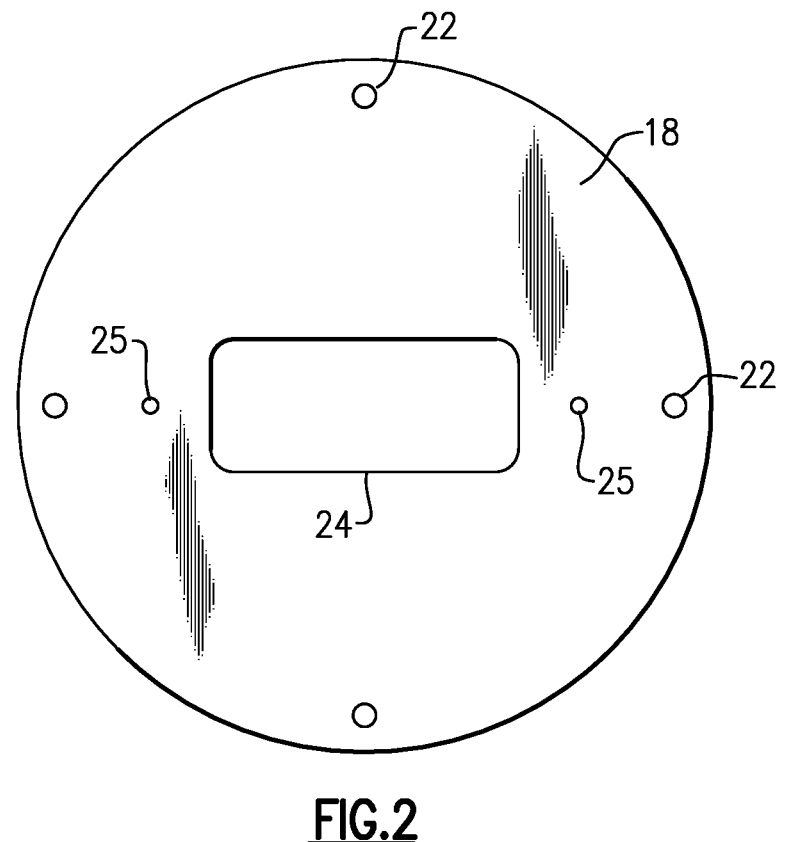
FIG. 2 is a top plan view of an access plate with openings for mounting and fastening the SkyVoice Alert LHA 500.

With reference to the Drawing, and initially to FIG. 1 thereof, a SkyVoice Alert LHA 500 unit 10 is shown here in its housing or case 12 has a base 14 that is mounted on a center of a disk-shaped inspection plate 18 (See also FIG. 2), which is normally mounted on an underside of a wing of the associated aircraft. The inspection plate is configured to close off a similar shaped opening on the wing lower surface, and can be removed to let personnel inspect the wing cavity. The unit could likewise be mounted on an underside of the empennage or fuselage where there is an unobstructed view of the ground beneath the aircraft. Different shapes of inspection plates and inspection ports are used on the various makes and models of aircraft. In this case, the inspection plate is for a Cessna airplane, and is five inches (127 mm) in diameter. In addition to screw openings 22 for attaching the inspection plate 18 to the inspection port, there is a center opening 24, racetrack shaped, and 39 mm by 25 mm as a viewing port for the Lidar of the SkyVoice Alert LHA 500. There is also a pair of 5 mm holes 25, 25, spaced 65.70 mm apart, for mounting the housing base 14.

Figures 3, 4, 5:
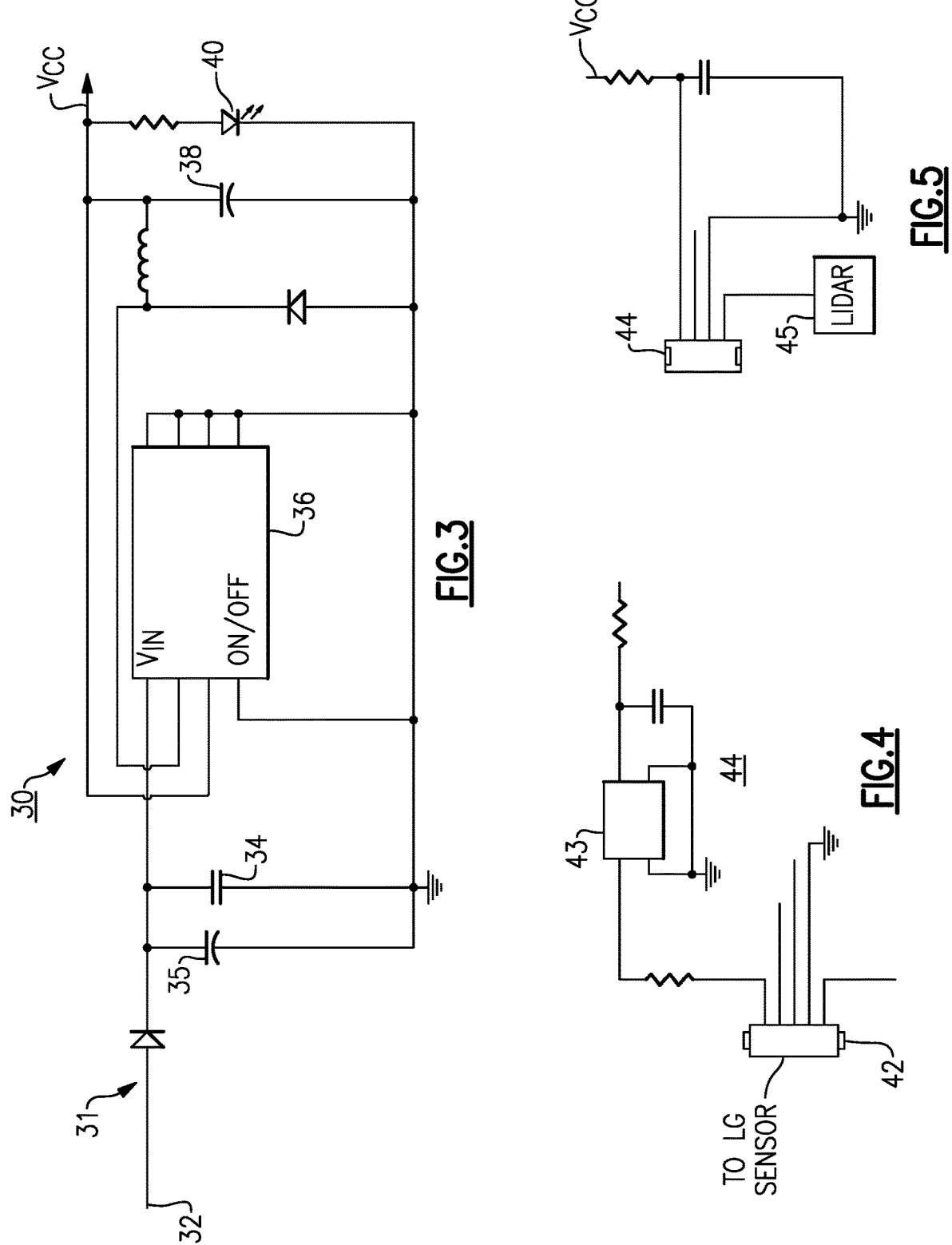
FIG. 3 is a diagram for the DC-DC power supply for embodiments of this invention.
FIG. 4 is a diagram of an up/down landing gear sensor.
FIG. 5 is a diagram for a LIDAR Connector circuit for embodiments of this invention.

As shown schematically in FIG. 3, a DC-to-DC power supply converter 30 has a DC input 31 coupled to the positive battery line 32 of the aircraft (typically providing twelve to twenty-four volts DC). A pair of input capacitors 34 and 35 shunt high frequency AF component to ground. To ensure smooth and constant DC output voltage, one of the input capacitors 35 is an electrolytic capacitor, here with a capacitance of up to 300 microfarads and a voltage rating of 50 volts. The input 31 feeds a voltage input VIN of the power supply IC 36, which also has a DC output terminal OUTPUT, a feedback terminal FEEDBACK, and one to several ground terminals that are respectively coupled to aircraft electrical ground GND. The output terminal feeds a controlled DC output that includes a large value output or smoothing capacitor 38. A red LED 40 provides visible indication that the DC supply is functioning.

The aforesaid DC supply converter 30 employs two electrolytic capacitors, 35 and 38, one on the input side (12/24 volt) and the other on the output side, i.e. 3.3 volts DC. Similar aircraft DC supply systems typically only use one electrolytic capacitor, that being on the 12/24 volt input side. Electrolytic capacitors provide longer life and improved performance when high frequencies are present on the input side or if a high frequency power supply is used to provide input DC current. Conventionally a smaller value ceramic capacitor is used at the output, 3.3 volt side rather than the electrolytic capacitor 38 here. The capacitor 38 of the arrangement shown here shunts to ground any HF noise that might be present on the regulated DC output.

A landing-gear up/down sensor 43 is coupled via a micro-connector 42 in FIG. 4. This is used to repeatedly notify the pilot that the landing gear is in the upward position and no elevation information will be announced.

As shown in FIG. 5, a micro-connector 44 connects with a LIDAR unit 45 to provide voltage to it and to bring the LIDAR output to the unit's processor.

Figure 6:
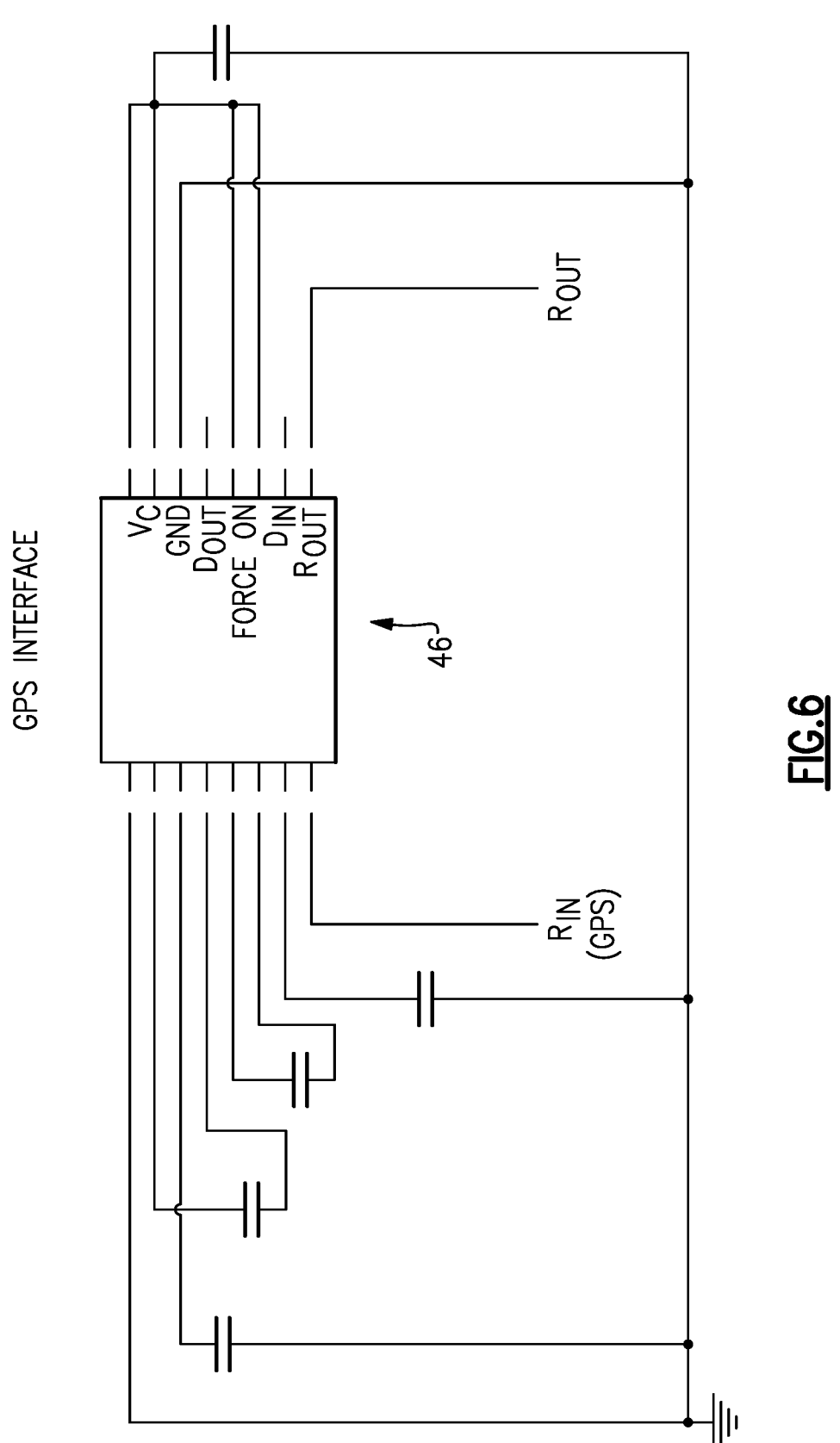
FIG. 6 a diagram of a GPS feed converter interface for use in embodiments of this invention.
Figure 7:
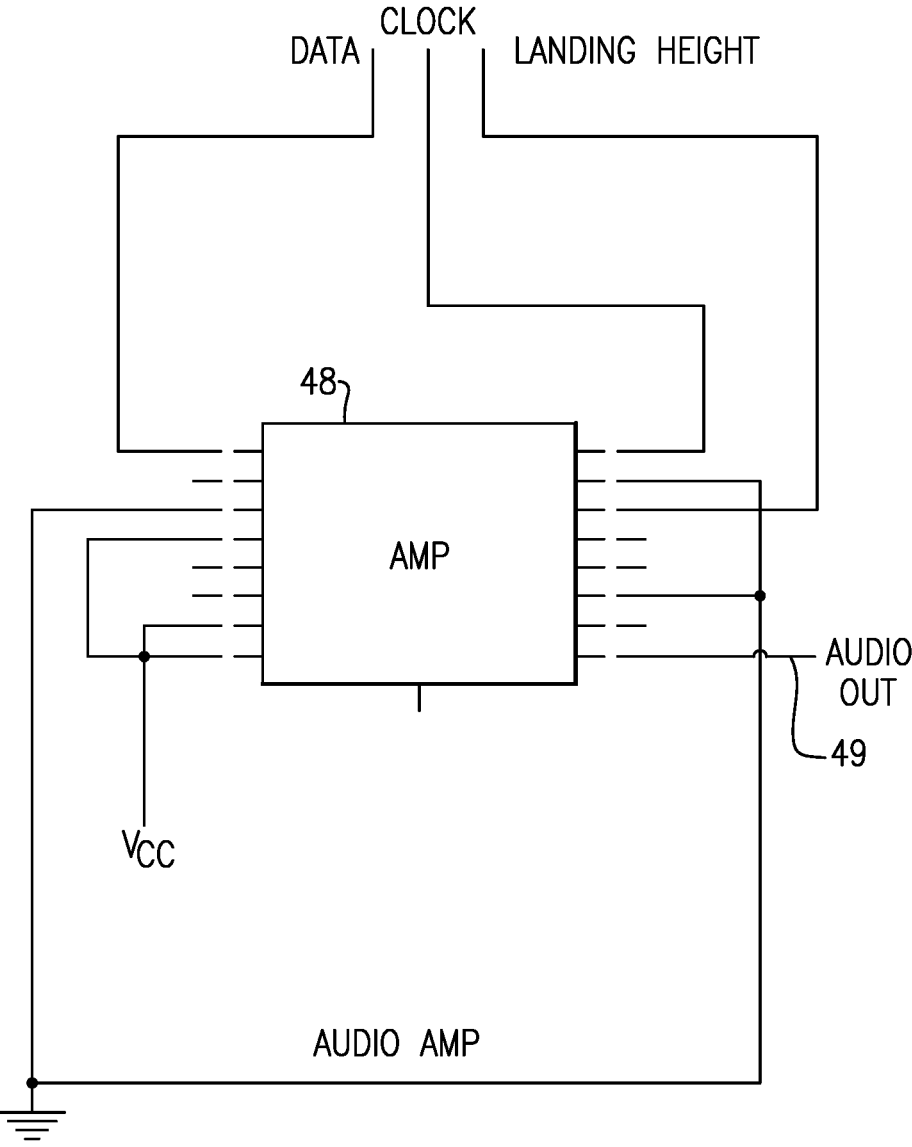
FIG. 7 is a diagram of an audio amplifier for carrying out the announcement functions of embodiments of this invention.

A GPS interface 46, shown in FIG. 6, connects with the aircraft's internal global positioning system device and allows the GPS data to be combined as needed with the LIDAR height data. The output audio that provides height announcements to the pilot can include a class-D audio amplifier circuit 48 (FIG. 7) with an output 49 providing audio announcements to the aircraft's audio panel or intercom, and may also provide audio to the mini-speaker and blue-tooth or wi-fi, as discussed above.

Figure 8:
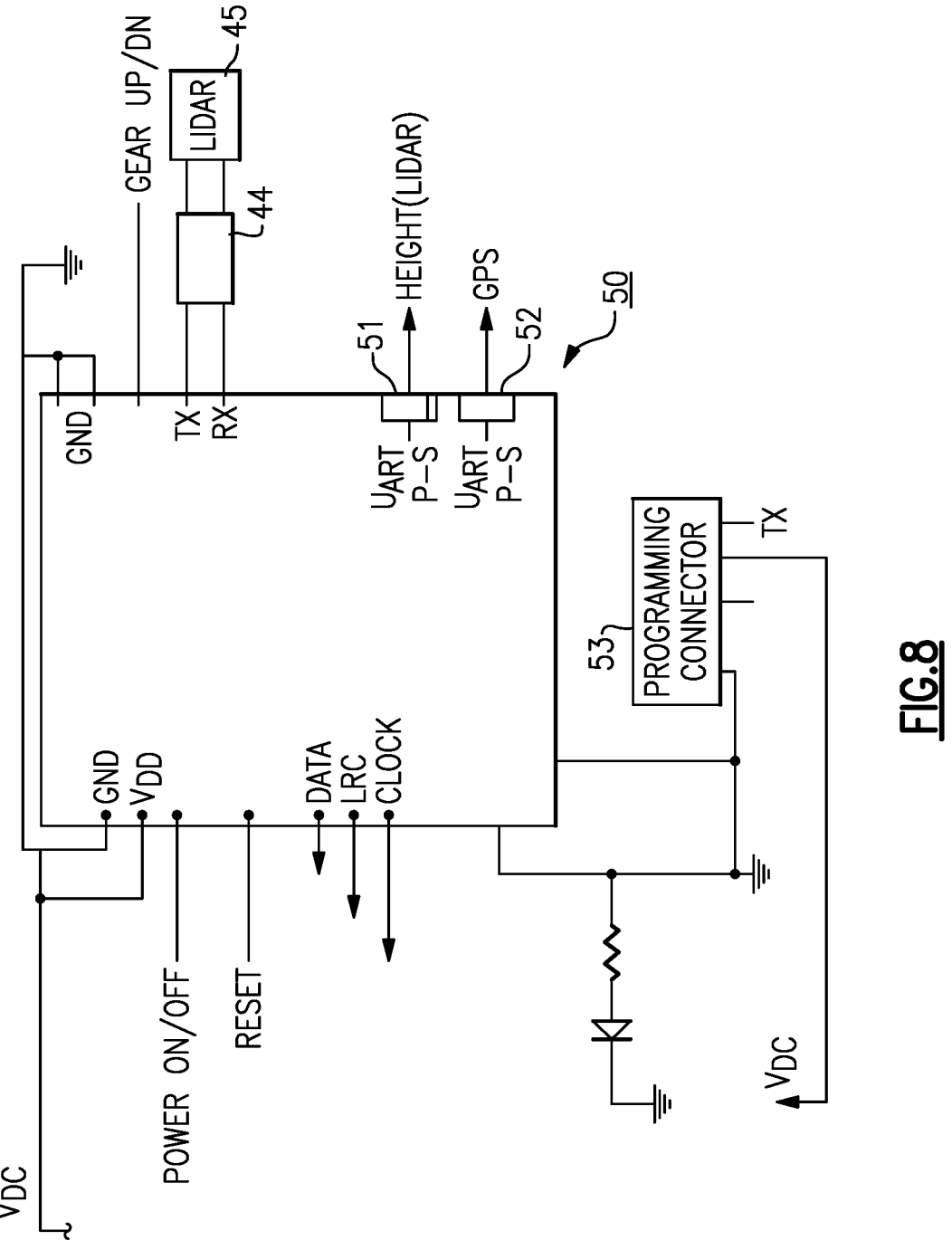
FIG. 8 shows the unit's microprocessor configured to provide LIDAR-based landing height announcements and other user-enabled reminders.

As illustrated in FIG. 8, the microcontroller unit 50 for the SkyVoice Alert LHA 500 has input and output ports connecting with the LIDAR (via micro-connector 44), and has two usable UART (universal asynchronous receiver-transmitter) blocks 51, 52. This means there is a hardware serial communications port 51 for the LIDAR-detected height and another hardware serial communications port 52 for GPS data. Hardware serial UART ports are more effective, faster and more efficient as compared with software serial communication. DC battery and ground connections are as shown, as are ports for power on/off, reset, data, clock, landing-gear up/down sensor, LIDAR send and detect, and other ports as needed. The microconnector 53 connects with the microcontroller unit 50 for programming the microcontroller unit 50.

Figure 9:
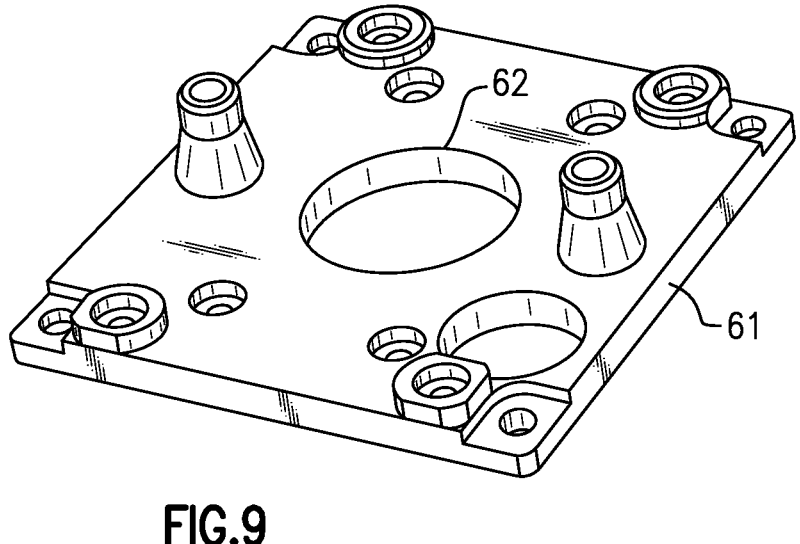
FIG. 9 is a top perspective view of a printed circuit board holder.
Figure 10:
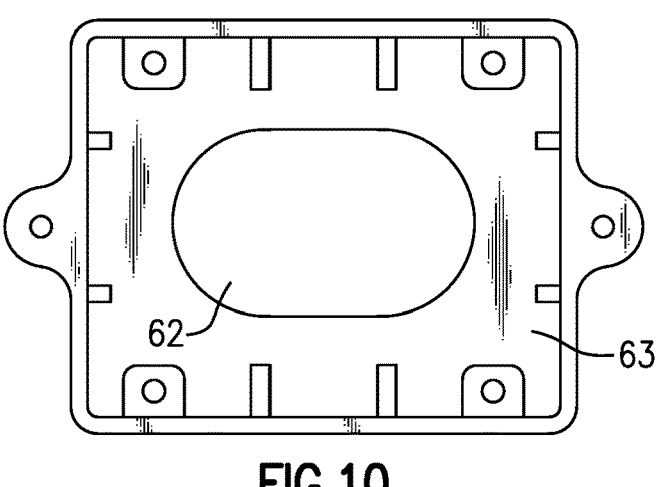
FIG. 10 is a top plan a housing base.
Figure 12:
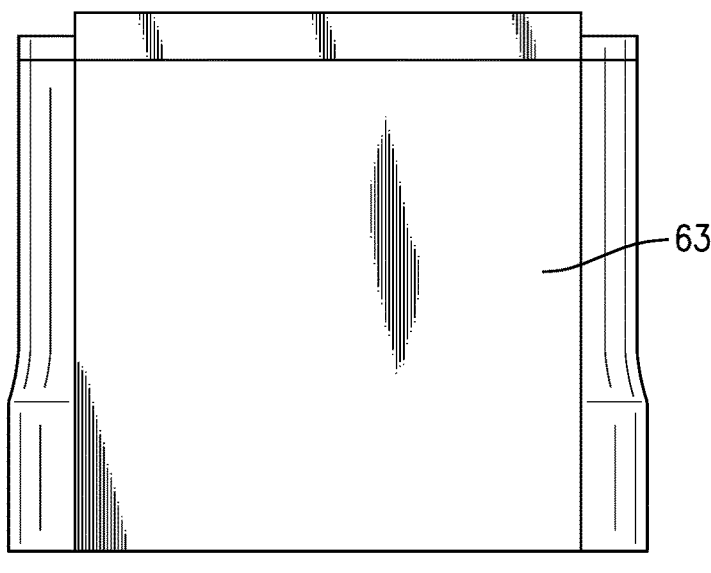
FIG. 12 is an elevation of the base.

FIG. 9 shows the mount or holder 61 for the printed circuit board or boards (discussed later), to fit within the enclosure, which is comprised also of the preferred enclosure, with rectangular enclosure base or body 63 shown in top plan in FIG. 10 and in elevation in FIG. 12.

Figure 11:
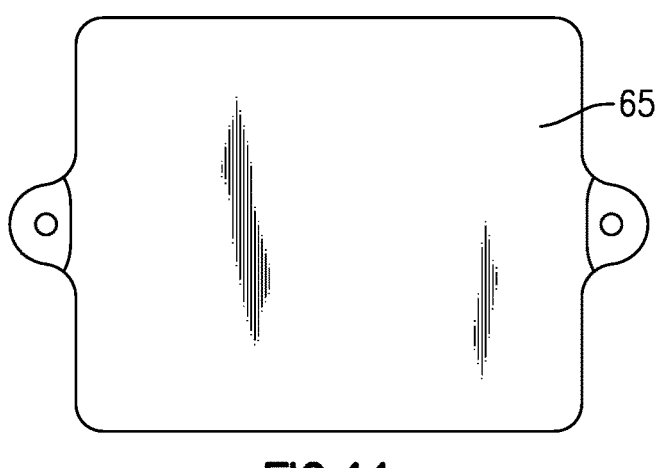
FIG. 11 is a top plan of a cover for this embodiment.

In the holder 61 of FIG. 9 a central opening 62 is provided for making connection between the LIDAR unit and printed circuit board. mounted on the holder. There can also be an opening(s) for the LIDAR beams emitted and returning, as need be. The top closure or lid or cover 65 appears in FIG. 11. FIG. 12 is an elevational view of the enclosure body or base 63.

The enclosure for the LIDAR and circuit boards is kept small, allowing more flexibility for installation in placing the device within the wing cavity so as not to mechanically interfere with other equipment or wiring in the wing cavity. The enclosure is dimensioned at 75 mm (length), 48.5 mm (width), and 61.0 mm (height) so that the device occupies minimal space above the inspection plate and within the wing cavity of the aircraft.

Figure 13:
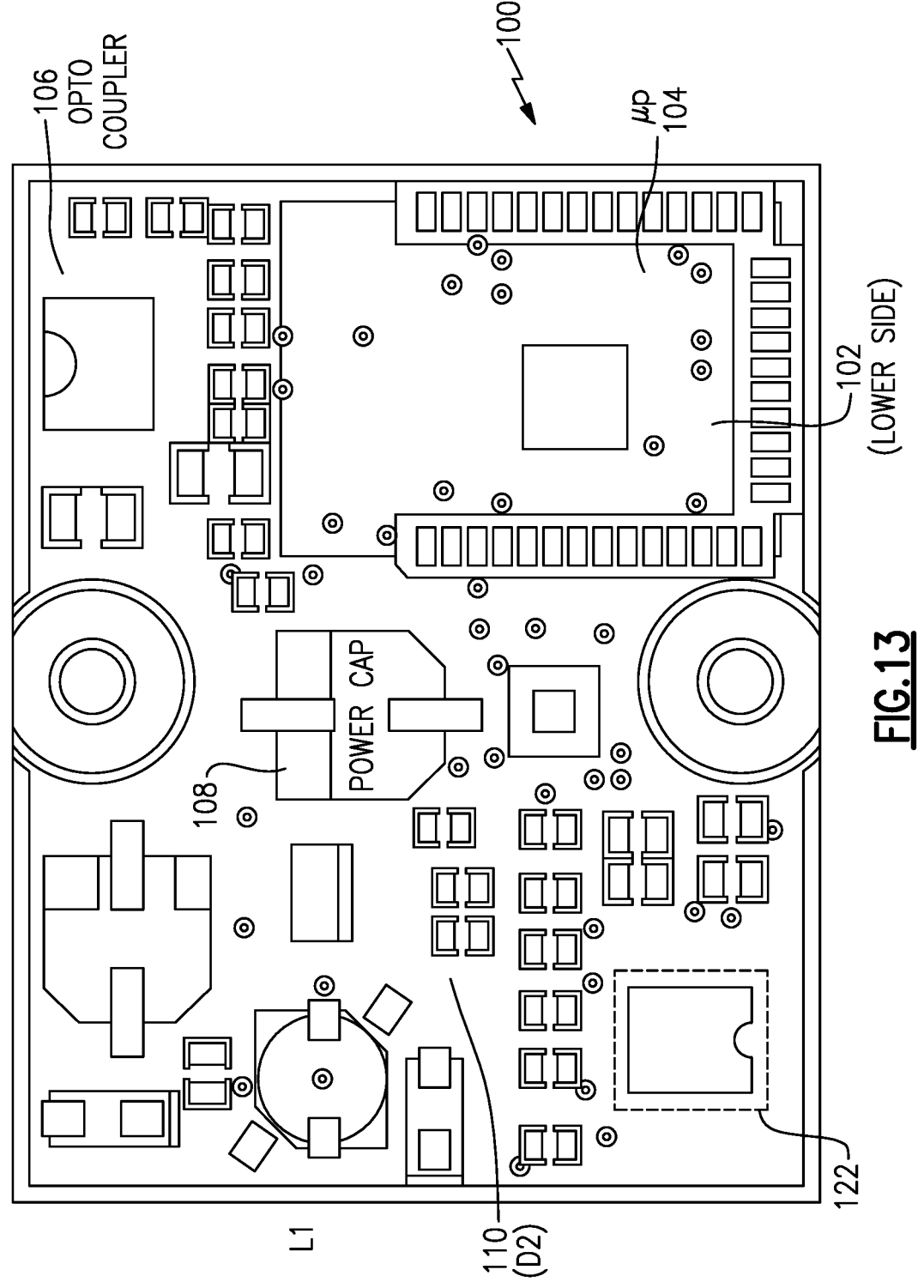
FIG. 13 shows an upper side of the printed circuit board of this embodiment.
Figure 14:
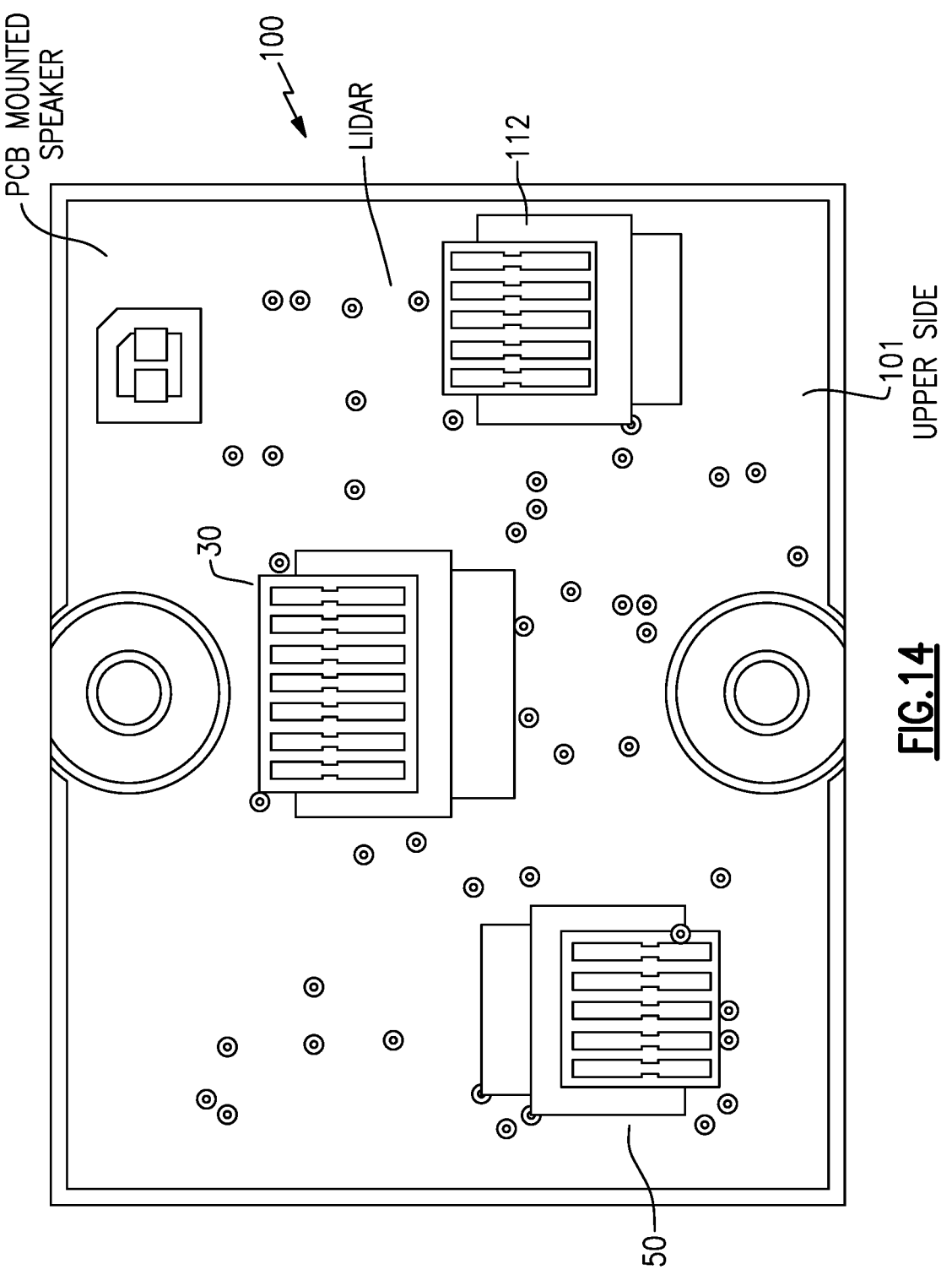
FIG. 14 shows a lower side of the printed circuit board of this embodiment.

FIGS. 13 and 14 show the circuit board(s) 100 with respective upper and lower sides, 102 and 101, respectively. A mounting area 104 is provided for the unit microprocessor, an area 106 for the opto-coupler to the audio panel, another area 108 for the large-value capacitor 38, and an area 110 for a red LED and an area 112 for the coupler 44 for the LIDAR unit.

Holes for mounting the PCB on the holder 61 are also shown. A Wi-Fi feature may be mounted on the board to connect with the microprocessor which permits the pilot to make adjustments and configuration changes using a suitably programmed smart phone (not shown).

The SkyVoice Alert LHA 500 has a mini-speaker mounted on its printed circuit board that allows the installer and the user to hear the audio announcements from the device itself (such as during installation). This is very helpful in detecting any wiring faults while extending the wires into the aircraft's audio panel.

Figure 15:
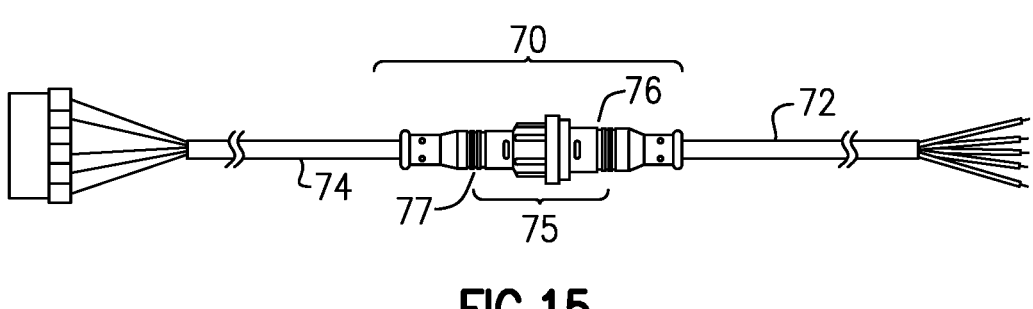
FIG. 15 is a two-ended, five conductor connector cable with male and female connectors at a midpoint thereof.

FIG. 15 illustrates a 5-wire cable 70 which has a first portion 72 with five leads to connect with the aviation battery, audio panel, metal grounding, GPS, landing gear switch, and a second portion 74 that connects with the SkyVoice Alert LHA 500 unit. A five-pin connector 75 has female and male parts 76, 77 that permit the first and second cable portions 72, 74 to be disconnected for removing and re-installing the SkyVoice Alert LHA 500 unit, when needed.

A LIDAR unit with improved measurable range is employed in the SkyVoice Alert LHA 500. The LIDAR is a model TF03-180-UART with a measurable range of up to 180 meters (i.e., about 590 feet) whereas prior attempts to use a LIDAR for vertical measurement have used units with a measurable range of only about 100 meters (less than 330 feet).

The SkyVoice Alert LHA 500 as described above is provided with an inspection plate to match with the aircraft on which it is to be installed. Inspection plates are provided e.g. to match Cessna, Piper, Bonanza or other airplanes. These have apertures for the LIDAR and screw holes for mounting on the inspection opening, so the customer does not have to cut the openings for the LIDAR and the housing or for the mounting screws as used in the existing inspection plate(s).

The foregoing and many other features and advantages of the device disclosed here will become apparent to persons skilled in this art and fit within the scope of the invention, as defined in the appended claims.

What is claimed is:

1. A Lidar-based SkyVoice Alert LHA 500 for a general-aviation aircraft provided with a downward looking Lidar affixed onto a removable access plate that fits onto an opening for a wing cavity or empennage cavity in such aircraft; the SkyVoice Alert LHA 500 comprising:

a housing affixed onto said access plate and adapted for aligning a laser beam from the Lidar with a window formed in said access plate;

DC-DC converter in said housing with an input receiving airplane battery power and an output providing regulated DC at a nominal DC voltage level;

a Lidar module mounted in said housing with a beam axis aligned with the opening in said access plate; the Lidar module providing height over ground data below a predetermined limit;

a connector cable permitting connection to and disconnection from an audio panel in said aircraft;

wherein said DC-DC converter includes an electrolytic capacitor at its DC output with a capacitance sufficient to damp out high frequency in said DC output.

2. The SkyVoice Alert LHA 500 of claim 1, including a Wi-Fi module and a Bluetooth module adapted to permit wireless connection to a cellular phone or equivalent controller device and to bluetooth enabled headsets/audio devices.

3. The SkyVoice Alert LHA 500 of claim 1, including a speaker adapted to be mounted within said housing providing an audible output during installation and set-up.

4. The SkyVoice Alert LHA 500 of claim 3, comprising a printed circuit board mounted on a circuit board holder within said housing, and wherein said-speaker includes a micro-speaker mounted on said printed circuit board.

5. The SkyVoice Alert LHA 500 of claim 1 wherein said connector cable includes a pair of five conductor wire cables respectively extending from a male and female connector component.

6. The SkyVoice Alert LHA 500 of claim 5, wherein said connector cable includes a first portion connecting to said printed circuit board and a second portion connecting to said airplane battery power and said audio panel; and further includes a five-pin male and female mating connector portions connected to said first and second portions of said cable.

7. The SkyVoice Alert LHA 500 of claim 1 wherein said electrolytic capacitor has a capacitance of substantially 300 microfarads.

* * * * *